(12) United States Patent
Heinz

(10) Patent No.: US 6,794,800 B1
(45) Date of Patent: Sep. 21, 2004

(54) PIEZOELECTRIC ACTUATOR WITH DOUBLE COMB ELECTRODES

(75) Inventor: Rudolf Heinz, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/719,742

(22) PCT Filed: Mar. 8, 2000

(86) PCT No.: PCT/DE00/00732

§ 371 (c)(1),
(2), (4) Date: May 21, 2001

(87) PCT Pub. No.: WO00/63980

PCT Pub. Date: Oct. 26, 2000

(51) Int. Cl.⁷ .......................................... H01L 41/047
(52) U.S. Cl. ...................................................... 310/366
(58) Field of Search ................................. 310/328, 366

(56) References Cited

U.S. PATENT DOCUMENTS

| | | | |
|---|---|---|---|
| 5,087,848 A | * | 2/1992 | Kelley et al. ................ 310/328 |
| 6,104,129 A | * | 8/2000 | Okamoto ..................... 310/366 |
| 6,208,026 B1 | * | 3/2001 | Bindig et al. ................ 257/718 |
| 6,597,086 B1 | * | 7/2003 | Boecking .................... 310/366 |
| 2002/0158552 A1 | * | 10/2002 | Nakamura et al. .......... 310/328 |

FOREIGN PATENT DOCUMENTS

| | | | | |
|---|---|---|---|---|
| DE | 196 50 900 A | | 6/1998 | ............. F01L/9/00 |
| EP | 0 844 678 A | | 5/1998 | ......... H01L/41/047 |
| JP | 55-50720 | * | 4/1980 | ................ 29/25.35 |

* cited by examiner

Primary Examiner—Thomas M. Dougherty
(74) Attorney, Agent, or Firm—Ronald E. Greigg

(57) ABSTRACT

The invention relates to a piezoelectric actuator, especially for actuating control valves or injection valves in motor vehicles, having an actuator body (1) in the form of a multilayer laminate of layered plies of piezoelectric material and intervening metal or electrically conductive layers (2a, 2b), acting as electrodes, which are contacted in alternation by metal outer electrodes (3, 5), facing one another on the jacket side in the longitudinal direction of the actuator body (1), that are at least in the form of laminar electrode strips (3), and the outer electrodes (3, 5) are in contact with electric terminal leads (7) for connecting the piezoelectric actuator to an electrical voltage. The piezoelectric actuator is characterized in that the outer electrodes (3, 5) also have additional electrodes (5) that are in contact at a plurality of points, via narrow elastic feet (6), with the laminar electrode strips (3).

20 Claims, 3 Drawing Sheets

PIEZOELECTRIC ACTUATOR WITH DOUBLE COMB ELECTRODES

CROSS-REFERENCE TO RELATED APPLICATIONS

Figure 1:
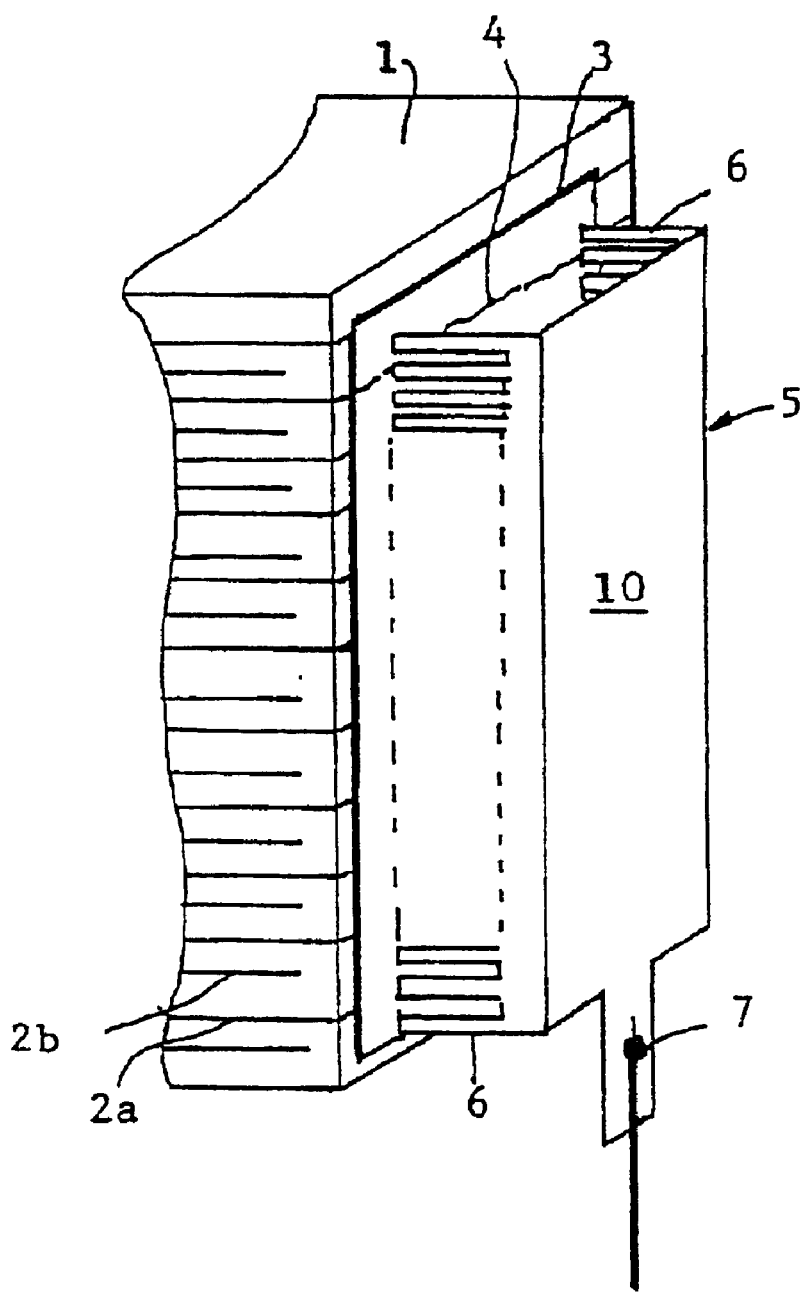

This is a 35 USC 371 application of PCT/DE 00/00732 filed on Mar. 8, 2000.

PRIOR ART

The invention relates to a piezoelectric actuator, especially for actuating control valves or injection valves in motor vehicles, having an actuator body in the form of a multilayer laminate of layered plies of piezoelectric material and intervening metal or electrically conductive layers, acting as electrodes, which are contacted in alternation by metal outer electrodes, facing one another on the jacket side in the longitudinal direction of the actuator body, that are at least in the form of laminar electrode strips, and the outer electrodes are in contact with electric terminal leads for connecting the piezoelectric actuator to an electrical voltage.

One such piezoelectric actuator is known for instance from German Patent Disclosure DE 196 50 900 A1 of Robert Bosch GmbH.

Multi-ply piezoelectric actuators of this kind, when they are subjected to a pulsating electrical voltage at their electrode layers, execute analogously pulsating strokes, changing the spacing between their two face ends. In DE 196 50 900 A1 cited above, the metal outer electrodes that transmit the electrical voltage to the electrode layers and are located on both sides on the jacket side in the longitudinal direction of the actuator body, cover the active region of the actuator body.

During operation of the multi-ply piezoelectric actuators, because of the low tensile strength between the thin, stacked films of piezoceramic (such as lead zirconate titanate) and the metal or electrically conductive electrode layers, delaminations can occur that can spread outward in the form of cracks into the outer electrodes and cause current interruptions.

OBJECTS AND ADVANTAGES OF THE INVENTION

It is accordingly the object of the invention to make possible a multi-ply piezoelectric actuator of this generic type in such a way that current-interrupting cracks in the outer electrodes can be spanned, thus improving the security is of the electrical contacting and lengthening the service life of the piezoelectric actuator.

The nucleus of the invention resides in connecting the laminar electrode strips resting directly on the actuator body additionally with these spanning additional electrodes, which are in contact at multiple points, via narrow elastic feet, with the laminar electrode strips.

Preferably, these additional electrodes take the form of a double comb, with a comb back parallel to the electrode strips and two parallel rows of teeth laterally adjoining the comb back, the teeth of which form the elastic feet and are in contact with the laminar electrode strips.

One advantage of this kind of double comblike additional electrode is its simple, secure fastening to the electrode strip as a consequence of the thin, elastic teeth of the comb. In Particular, an arbitrarily thick solder layer can be used for contacting and additionally serves to dissipate heat from the actuator body.

The many design options of the double comb enable optimal fastening, simplification of production, and optimal checking of the fastening of the double comblike additional electrode to the laminar electrode strips.

The double comb acting as an additional electrode, after being attached to the laminar electrode strips, develops intrinsic stability on the actuator body that can be still further enhanced by an elastomer additive. The two rows of combs, over the service life of the piezoelectric actuator, offer a high degree of security from cracks that might occur.

Because the comb back is virtually closed and there is a heat-diverting elastomer, good cooling of the actuator body is possible.

A piezoelectric actuator according to the invention can advantageously be used for diesel or gasoline injection systems in the motor vehicle. A piezoelectric actuator of this kind, because it is capable of faster switching, can advantageously replace the electromagnetic system typically used as an adjusting device in injection systems.

The above characteristics and further advantageous characteristics of a piezoelectric actuator according to the invention will become even clearer from the ensuing description of a plurality of exemplary embodiments thereof, when the description is read in conjunction with the drawing.

DRAWINGS

FIG. 1 schematically and in perspective shows a portion of a preferred exemplary embodiment of a piezoelectric actuator according to the invention, equipped with a double comb additional electrode.

Figure 2:
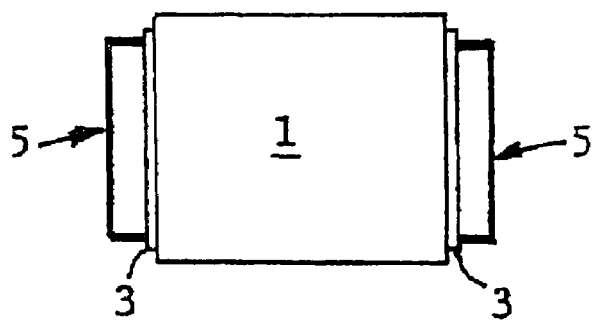

FIG. 2 shows the preferred exemplary embodiment of FIG. 1 in a plan view.

FIGS. 3–8 and 9A–C each show various kinds of exemplary embodiments of a double comblike additional electrode and its fastening to the electrode strips.

Figure 10A:
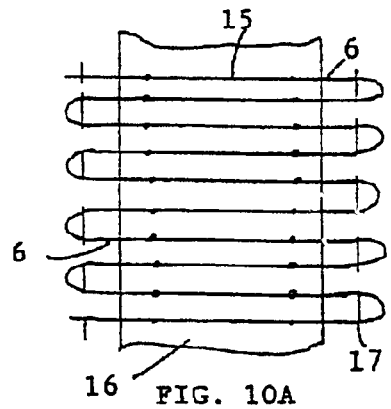
Figure 10B:
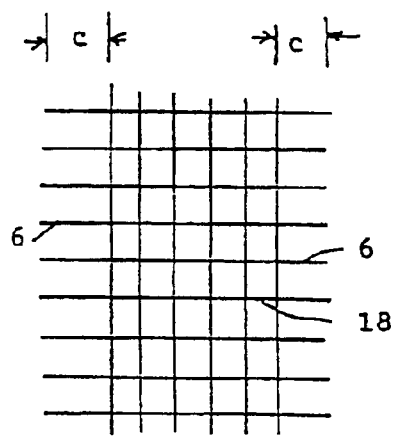
Figure 11A:
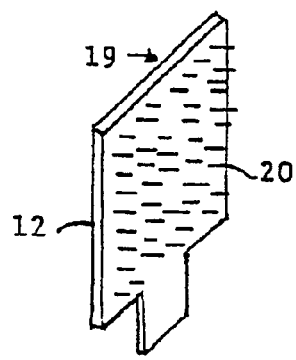
Figure 11B:
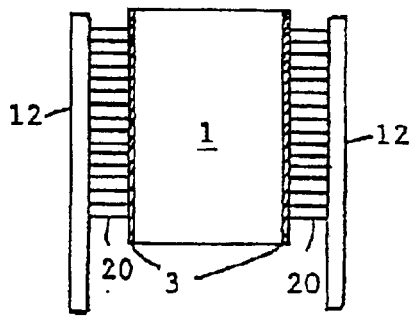

FIGS. 10A and 10B schematically show two possible production methods for a double comb additional electrode with the aid of wires; and FIGS. 11A and 11B schematically show an alternative form of additional electrodes, embodied as brushes, according to the invention.

EXEMPLARY EMBODIMENTS

In FIG. 1, in a perspective view, a first exemplary embodiment of a piezoelectric actuator provided with a double comblike additional electrode 5 is shown. The actuator body 1, which for instance is rectangular, is in the form of a multi-layer laminate comprising stacked plies of piezoelectric material and intervening metal or electrically conductive layers 2a and 2b acting as electrodes. The electrode layers 2a and 2b are contacted in alternation by means of metal outer electrodes 3 and 5, facing one another, on the jacket side in the longitudinal direction of the actuator body 1 and are connected to electrical terminal leads 7, which are connected to the double comblike additional electrode 5.

As mentioned, in the operation of such multi-ply piezoelectric actuators, because of the low tensile strength, delaminations can occur between the ceramic piezoelectric material and the metal inner electrodes, and these delaminations can spread outward in the form of cracks into the laminar electrode strips 3 and lead to current interruptions. One such crack 4 is shown as an example in FIG. 1. By means of the additional electrode 5 in the form of a double comb, which comprises a comb back 10 located parallel to the laminar electrode strip 3 and two lateral toothed edges bent approximately at a right angle away from the comb back 10 toward the associated laminar electrode strip 3, with the narrow teeth 6 of the edges in electrical contact with the laminar electrode strip 3, a current interruption of the kind threatened by the crack 4 can be spanned. The thin teeth 6 of the double comb form many elastic feet, which can elastically intercept the motion of the actuator body 1 dictated by the actuator stroke and which thereby assure a durable contacting of the additional electrode 5 with the laminar electrode strip 3. The elastic teeth 6 can lead into the laminar electrode strips 3 or can be secured to the surface, for instance being soldered, welded, bonded, and so forth.

It can be seen that the perspective view in FIG. 1 shows only one side of the rectangular piezoelectric actuator.

The schematic plan view on such a piezoelectric actuator shown in FIG. 2 shows that two double comblike additional electrodes 5 face one another on the jacket sides of an actuator body 1 and are each in electrical contact with one electrode strip 3.

Figure 3:
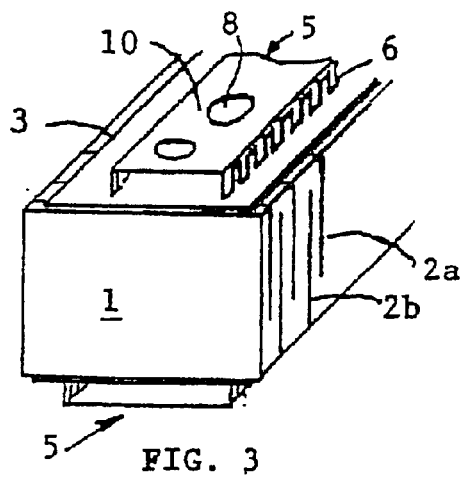
Figure 4:
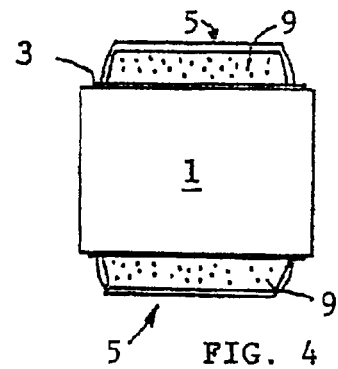

Various forms of double comb electrodes to be used according to the invention as additional electrodes 5 are described below in conjunction with FIGS. 3–9. FIG. 3 shows a flat double comb electrode 5 with a plane comb back 10 and 5 teeth 6 angled 90° away from it and with bores or holes 8 on the comb back 10.

Through the bores 8, plastic, adhesive or an elastomer 9 (see FIG. 4) can be poured in as needed, in order to stabilize the double comb 5 and/or to divert the heat to outside.

Figure 5:
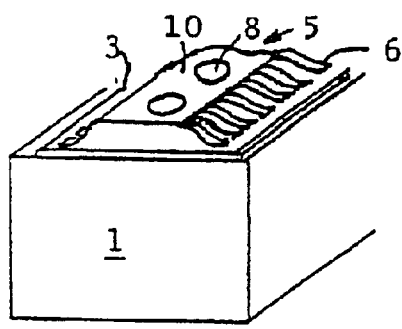

FIG. 5 shows a further exemplary embodiment of a double comb electrode acting as an additional electrode 5, in which the teeth 6 of the comb are bent only slightly away from the plane comb back 10 toward the electrode strips 3 and are in contact, by their respective end portion, with the respective electrode strip 3. The fastening can be done by soldering (hard or soft), laser welding, spot welding, friction welding, or bonding. The quality of the fastening of the outward-protruding teeth 6 of the comb is easy to check.

Figure 6:
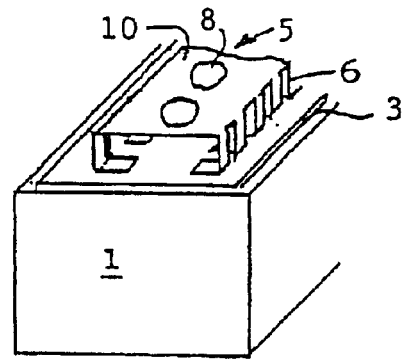

A further exemplary embodiment of a double comb electrode suitable as an additional electrode 5 is shown in FIG. 6. The teeth 6, seated on both sides of a plane comb back 10 are first bent outward from the comb back 10 by 90° toward the electrode strip 3 and then are bent inward parallel to the electrode strip 3.

Figure 7:
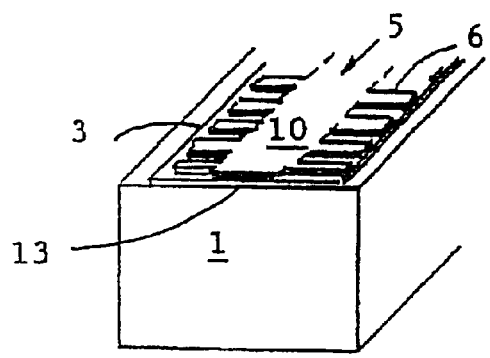

In FIG. 7, a further exemplary embodiment is shown of a double comb electrode according to the invention suitable as an additional electrode, in which the comb back 10 and the teeth 6 are located approximately in the same plane. To protect against being soldered on completely (if solder is employed), a solder stop paint 13 is applied in the middle below the comb back 10. If a soldering operation is not employed, then a spacer 13 embodied as an elastomer layer can maintain the necessary spacing between the laminar electrode strip 3 and the comb back 10. A PTFE layer 13 or a layer of similar material can also serve as wear protection or as a damping layer.

Figure 8:
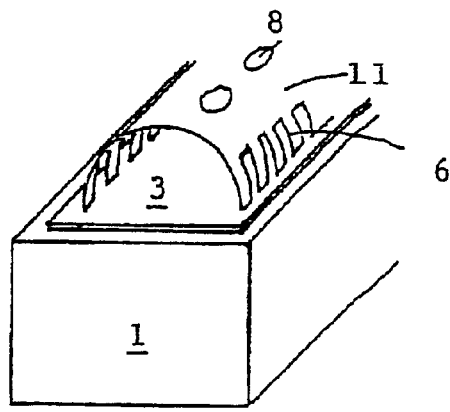

FIG. 8 shows a further possible exemplary embodiment of a double comb electrode according to the invention, suitable as an additional electrode 5, which has a half-round or oval cross-sectional form with a rounded comb back 11.

Figure 9A:
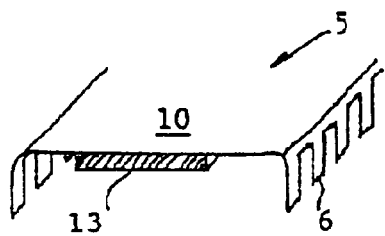
Figure 9B:
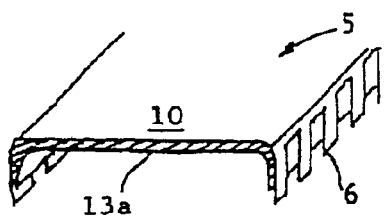
Figure 9C:
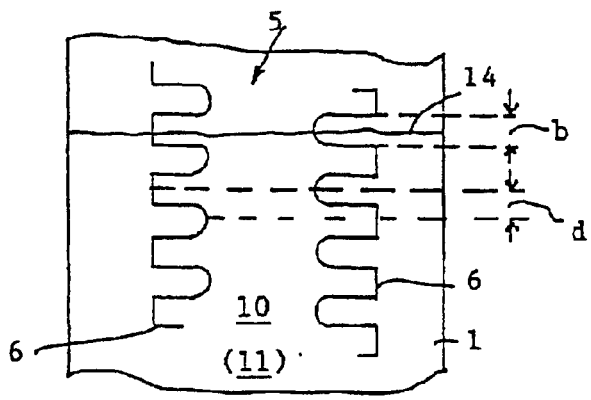

FIGS. 9A, 9B and 9C show a further exemplary embodiment of a double comb electrode according to the invention, suitable as an additional electrode 5 for a piezoelectric actuator according to the invention, which is shaped similarly to that of FIG. 6 and which on both sides of the plane comb back 10 has teeth 6 that are bent approximately 90° from the comb back 10.

FIG. 9A shows the spacer or a solder stop paint 13.

FIG. 9B shows that instead of a spacer or a solder stop paint 13, an elastomer plate or plastic plate 13a extending around the corner to near the end of the teeth 6 of the comb can be employed.

As the basic outline shown in FIG. 9C of a double comb electrode, suitable as an additional electrode 5, of arbitrary cross-sectional shape (rectangular or round or oval as in FIG. 8) shows, the teeth 6 of the comb that act as elastic feet are offset from one another on the two sides of the comb back 10 or 11 by one-half a spacing interval d of the teeth 6 in the longitudinal direction of the double comb. A crack 14 that occurs in the actuator body 1 usually takes a straight course (that is, at an angle of 90° to the outer edge of the actuator body 1) through the flat electrode strips 3 of the outer electrodes. Because of the offset of the teeth 6 of the comb by half the spacing interval, or d, a crack will interfere with only one tooth, while the opposed, offset tooth remains completely fixed. The spacing interval 2d and the gaps b between teeth can be adapted to the least possible spacings between successive cracks, so that no crack will extend into two feet 6 that face one another.

The production of a double comb described thus far and suitable as an additional electrode 5 can be done for instance by stamping out a suitable double comb shape from a metal sheet of suitable material and optionally at the same time bending the two rows of teeth away. Alternatively, a very fine double comb structure can also be produced by laser cutting it from a sheet of suitable material.

FIGS. 10A and 10B show further examples of simple production methods for a double comb suitable as an additional electrode 5. In FIG. 10A, a wire 15 is bonded, welded or soldered to a sheet-metal band 16, and the ends 17 of the wire are cut off. In this way, a double comb suitable as an additional electrode for a piezoelectric actuator according to the invention is created that has very narrow teeth 6.

In Fig. 10B, alternatively, a double comb suitable as an additional electrode 5 for a piezoelectric actuator according to the invention is produced from a metal sieve. To that end, the metal transverse filaments 18 of the sieve must protrude on the side by a sufficiently great distance c to produce a double comb structure.

In the description thus far, various types of double comb electrodes have been described for the additional electrode 5. In FIG. 11A, however, a brushlike structure 19 can also serve as an alternative additional electrode 5; it has elastic metal bristles 20 protruding approximately perpendicularly from a flat metal brush back 12, and the ends of the bristles are contacted with the electrode strips 3 in accordance with FIG. 11B.

In all the exemplary embodiments described above, the teeth or bristles of a double comb acting as an additional electrode 5, or of a brushlike structure as in FIG. 11, can be hard- or soft-soldered to the electrode strips 3 or joined to them by laser welding or spot welding, friction welding, or bonding. Adhesive bonding with electrically conductive adhesive is also possible. In the soldering, welding or bonding operation, the quality of the connection of the teeth or bristles, protruding from the comb back or brush back, to the electrode 3 is easy to check.

A simple, secure fastening of the electrode 5 to the flat electrode strips 3 is thus possible because of the thin teeth or bristles. An arbitrarily thick solder layer can be employed. The various possible embodiments described for the teeth of the comb or the bristles enable optimal fastening, economical production, and reliable checking of the fastening of the teeth or bristles to the electrode strips 3. The usually greater thermal expansion of the additional electrode 5 compared to the ceramic causes only slight shear stresses, and thus greater security against failure, because of the small contacts between the additional electrode 5 and the electrode strip 3.

Because of its shape, once it is attached to the laminar electrode strips, or because of an additionally introduced elastomer layer, the additional electrode is lent adequate intrinsic stability. A double comb can be produced economically in many ways. Since as proposed here a comb electrode suitable as an additional electrode has two rows of teeth, high assurance is provided that as many teeth of the comb electrode as possible are electrically conductively connected to the associated electrode strip. Because the metal comb back of the double comb is virtually closed, except for the openings 8, and because of an optionally introduced heat-conducting elastomer, a good capability of heat dissipation from the actuator body is attainable.

The foregoing relates to preferred exemplary embodiments of the invention, it being understood that other variants and embodiments thereof are possible within the spirit and scope of the invention, the latter being defined by the appended claims.

I claim:

1. A piezoelectric actuator, especially for actuating valves in motor vehicles, having an actuator body (1) in the form of a multilayer laminate of layered plies of piezoelectric material and intervening electrically conductive layers (2a, 2b), acting as electrodes, which are contacted in alternation by outer electrodes (3, 5), facing one another on the jacket side in the longitudinal direction of the actuator body (1), which outer electrodes (3, 5) are in the form of electrode strips (3), and additional electrodes (5), and the outer electrodes (3, 5) are in contact with electric terminal leads (7) for connecting the piezoelectric actuator to an electrical voltage, wherein the additional electrodes (5) are in contact at a plurality of points, via narrow elastic feet (6), with the electrode strips (3).

2. The piezoelectric actuator of claim 1, wherein the additional electrodes (5) form comblike strips that have equidistant teeth (6) forming the elastic feet.

3. The piezoelectric actuator of claim 1, wherein the additional electrodes (5) have a comb back (10, 11), and adjoining it two parallel lateral rows of teeth, whose teeth (6) are the elastic feet.

4. The piezoelectric actuator of claim 2, wherein the additional electrodes (5) have a comb back (10, 11), and adjoining it two parallel lateral rows of teeth, whose teeth (6) are the elastic feet.

5. The piezoelectric actuator of claim 3, wherein the teeth (6) are angled approximately perpendicular from the comb back (10) to the electrode strips (3), and only the ends of the teeth (6) are in contact with the respective electrode strip (3).

6. The piezoelectric actuator of claim 3, wherein the teeth (6) are angled at a shallow flat angle from the comb back (10) to the electrode strips (3), and the end portions of the teeth (6) are in contact with the respective electrode strip (3).

7. The piezoelectric actuator of claim 3, wherein the comb back (11) has the teeth (6) on both sides, and has an approximately semicircular or oval cross-sectional contour.

8. The piezoelectric actuator of claim 3, wherein the comb back (14) has the teeth on both sides, and is located approximately in the same plane as the teeth (6).

9. The piezoelectric actuator of claim 3, wherein a spacer (13) is located between the comb back (10, 11 ) and the associated electrode strip (3).

10. The piezoelectric actuator of claim 9, wherein the spacer (13) is an elastomer underlay.

11. The piezoelectric actuator of claim 9, wherein the spacer (13) is a solder stop paint.

12. The piezoelectric actuator of claim 3, wherein the equidistant teeth (6) on the two sides of the comb back (10, 11) are offset from one another by one-half the spacing interval of the teeth (6) in the longitudinal direction of the double comb.

13. The piezoelectric actuator of claim 4, wherein the equidistant teeth (6) on the two sides of the comb back (10, 11) are offset from one another by one-half the spacing interval of the teeth (6) in the longitudinal direction of the double comb.

14. The piezoelectric actuator of claim 1, wherein the additional electrode (5) forms an electrode brush (19), located parallel to the electrode strips (3), whose bristles (20) form the elastic feet contacted with the electrode strips (3).

15. The piezoelectric actuator of claim 1, wherein the additional electrode (5) has a plurality of holes (8).

16. The piezoelectric actuator of claim 1, wherein the terminal leads (7) are each connected to the additional electrodes (5).

17. The piezoelectric actuator of claim 1, wherein the elastic feet (6) of the additional electrodes (5) are soldered to the electrode strips (3) by a solder layer.

18. The piezoelectric actuator of claim 1, wherein the elastic feet (6) of the additional electrodes are mounted to the electrode strips (3) by an electrically conductive adhesive layer.

19. The piezoelectric actuator of claims 1, wherein the elastic feet (6) of the additional electrodes (5) are soldered to the electrode strips (3) by laser-welded spots.

20. The piezoelectric actuator of claim 1, wherein the elastic feet (6) of the additional electrodes (5) are bonded to the electrode strips (3).

* * * * *

UNITED STATES PATENT AND TRADEMARK OFFICE
CERTIFICATE OF CORRECTION

PATENT NO. : 6,794,800 B1
DATED : September 21, 2004
INVENTOR(S) : Rudolf Heinz

It is certified that error appears in the above-identified patent and that said Letters Patent is hereby corrected as shown below:

<u>Title page,</u>
Insert Item:
-- [30]  Foreign Application Priority Data
      April 20, 1999  (DE)  ………….  199 17 728.7 --

Signed and Sealed this

Eighteenth Day of January, 2005

JON W. DUDAS
*Director of the United States Patent and Trademark Office*